United States Patent [19]
Liu et al.

[11] Patent Number: 5,990,515
[45] Date of Patent: Nov. 23, 1999

[54] TRENCHED GATE NON-VOLATILE SEMICONDUCTOR DEVICE AND METHOD WITH CORNER DOPING AND SIDEWALL DOPING

[75] Inventors: Yowjuang W. Liu, San Jose; Donald L. Wollesen, Saratoga, both of Calif.

[73] Assignee: Advanced Micro Devices, Inc., Sunnyvale, Calif.

[21] Appl. No.: 09/052,062

[22] Filed: Mar. 30, 1998

[51] Int. Cl.$^6$ ................................................ H01L 29/72
[52] U.S. Cl. .................. 257/316; 257/322; 257/335; 257/345; 257/388; 438/211; 438/259; 438/266; 438/270; 438/696
[58] Field of Search ...................................... 257/316, 322, 257/335, 388; 438/211, 259, 266, 270, 696

[56] References Cited

U.S. PATENT DOCUMENTS 5,770,878 6/1998 Beasom .................................... 257/332

*Primary Examiner*—Edward Wojciechowicz
*Attorney, Agent, or Firm*—Fenwick & West LLP

[57] ABSTRACT

A non-volatile semiconductor cell structure and method comprises a trenched floating gate, a sidewall doping and a corner doping and further includes a sidewall doped region, a corner doped region, a channel region, and an inter-gate dielectric layer, and a control gate. The trenched floating gate is formed in a trench etched into the semiconductor substrate. In a preferred embodiment, the trenched floating gate has a top surface which is substantially planar with a top surface of the semiconductor substrate. The control gate and the inter-gate dielectric are formed on the top surface of the trenched floating gate. The sidewall doped region and the corner doped region are laterally separated by the trench in which the trenched floating gate is formed. The sidewall doped region has a depth which is greater than the depth of the trench, and the corner doped region has a depth which is less than the depth of the trench. The sidewall doping is a diffusion region formed in the sidewall doped region of the semiconductor substrate and is immediately contiguous to a vertical sidewall of the trench and immediately contiguous to the substrate surface. The corner doping is a diffusion region formed in the corner doped region of the semiconductor substrate and is immediately contiguous the upper vertical sidewall of the trench which is opposite the vertical sidewall along which the sidewall doping is formed and is immediately contiguous the substrate surface.

17 Claims, 8 Drawing Sheets

TRENCHED GATE NON-VOLATILE SEMICONDUCTOR DEVICE AND METHOD WITH CORNER DOPING AND SIDEWALL DOPING

RELATED APPLICATIONS

The subject matter of this application is related to the subject matter of commonly assigned U.S. patent applications having the following serial numbers: Ser. No. 09/052,051, Ser. No. 09/052,057, and Ser. No., 09/052,058, all concurrently filed herewith.

FIELD OF THE INVENTION

The present invention relates generally to semiconductor devices and methods of manufacture, and more particularly, to semiconductor devices and methods of manufacture including a trenched gate.

BACKGROUND OF THE INVENTION

Conventional semiconductor non-volatile memories, such as read-only memories (ROMs), erasable-programmable ROMs (EPROMs), electrically erasable-programmable ROMs (EEPROMs), and flash EEPROMs are typically constructed using a double-poly structure. Referring now to FIG. 1, there is shown a cross-sectional view of the cell structure of a conventional nonvolatile memory device 100 including a substrate 102 of a semiconductor crystal such as silicon. The device 100 also includes a channel region 104, a source region 106, a drain region 108, a floating gate dielectric layer 110, a floating poly gate electrode 112, an inter-gate dielectric layer 114, and a control poly gate electrode 116. The floating gate dielectric layer 110 isolates the floating gate from the underlying substrate 102 while the inter-gate dielectric layer 114 isolates the control and floating gates. As shown in FIG. 1, the floating gate dielectric layer 110, the floating poly gate electrode 112, the inter-gate dielectric layer 114, and the control poly gate electrode 116 are all disposed on the surface of the substrate 102.

As semiconductor devices and integrated circuits are scaled down in size, demands for the efficient use of space have increased. Heretofore, conventional non-volatile devices have utilized a cell structure where the floating gate and control gate are formed on a top surface of the semiconductor substrate as shown in FIG. 1. However, this type of cell structure is limited to the degree to which the active devices can be made smaller in order to increase cell packing density and performance. Additionally, the stacked dual gate structure which is formed on the substrate surface is sensitive to the overlaps between the floating gate and the source and drain junctions.

SUMMARY OF THE INVENTION

In accordance with the present invention, a non-volatile semiconductor device is fabricated to include a trenched floating gate, a control gate, a corner doping and a sidewall doping. The device also includes a sidewall doped region and a corner doped region. Embodiments employing the principles of the present invention improve the device scaleability and cell packing density by reducing the lateral diffusion of the source and drain regions under the trenched floating gate. The reduced lateral diffusion of the source and drain regions under the trenched floating gate also minimizes the sensitivity to process variations of overlaps between the trenched floating gate and the source and drain regions. Moreover, the present invention reduces the stacked gate height of the structure thus providing better process control and manufacturability. Furthermore, a device fabricated according to the principles of the present invention can be more efficiently programmed and erased than conventional non-volatile devices.

In one embodiment of the present invention, a cell structure for a non-volatile semiconductor device includes a trenched floating gate, a control gate, a sidewall doping, and a corner doping. The trenched floating gate is formed in a trench etched into a semiconductor substrate. The cell structure further includes a sidewall doped region, a corner doped region, and a channel region which is implanted in the substrate beneath the bottom surface of the trench. The sidewall doped region has a depth which is equal to or greater than the depth of the trench and the corner doped region has a depth which is less than the depth of the trench. In one embodiment, the sidewall doped region is the source region for the device and the corner doped region is drain region for the device. In another embodiment, the sidewall doped region is the drain region for the device and the corner doped region is the source region for the device. An inter-gate dielectric layer is formed on a top surface of the trenched floating gate, and the control gate is fabricated on the inter-gate dielectric layer. The sidewall doping is formed in the semiconductor substrate and is immediately contiguous to a vertical sidewall of the trench and immediately contiguous to the substrate surface, and substantially extends along the entire sidewall of the trench. The corner doping is formed in the semiconductor substrate just below the substrate surface. The corner doping is immediately contiguous to the upper vertical sidewall of the trench which is opposite the sidewall along which the sidewall doping is formed and is immediately contiguous to the substrate surface In accordance with the present invention, a trenched floating gate semiconductor device with a corner doping and a sidewall doping is fabricated by first etching a trench in the silicon substrate. The substrate is then implanted with dopant impurities to form a channel region beneath the bottom surface of the trench. The sidewall doping is then formed by implanting the substrate at an angle with dopant impurities. After the sidewall doping has been formed, a trench-to-gate insulating layer is deposited in the trench followed by a layer of polysilicon to form the trenched floating gate. The polysilicon layer is planarized and an inter-gate dielectric layer is formed on a top surface of the trenched floating gate. A control gate is then fabricated on the inter-gate dielectric layer. After the control gate has been formed, the substrate is then masked to define the location of the corner doping and is implanted with dopant impurities to form the corner doping. Finally, control gate spacers are formed at the vertical side surfaces of the control gate and on the inter-gate dielectric layer, and a sidewall doped region and a corner doped region are implanted into the substrate.

DESCRIPTION OF THE PREFERRED EMBODIMENT

Figure 1:
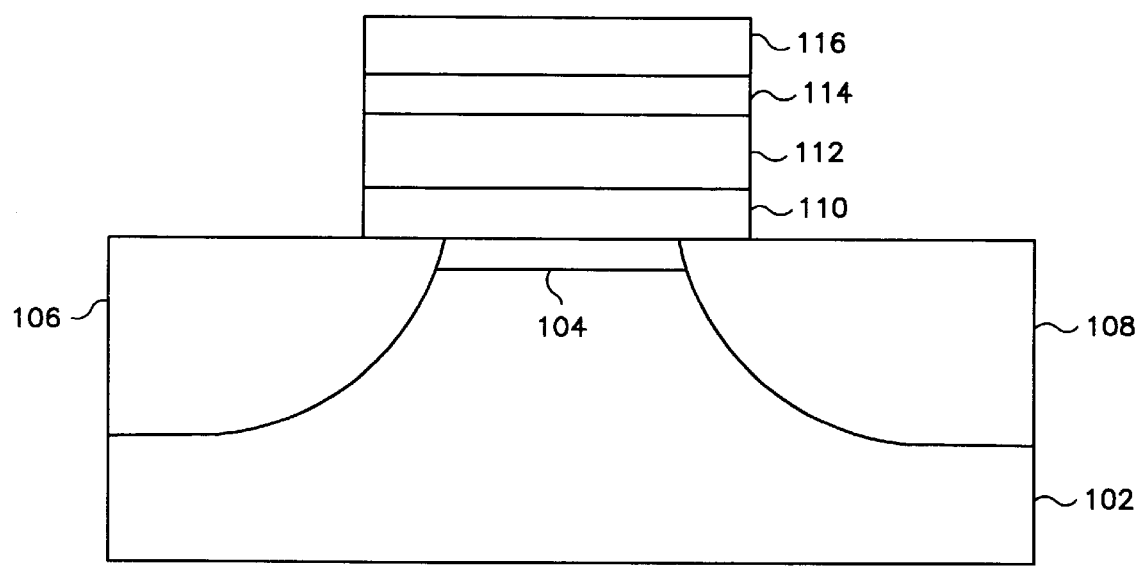
FIG. 1 is a cross-sectional view of conventional non-volatile device.
Figure 2:
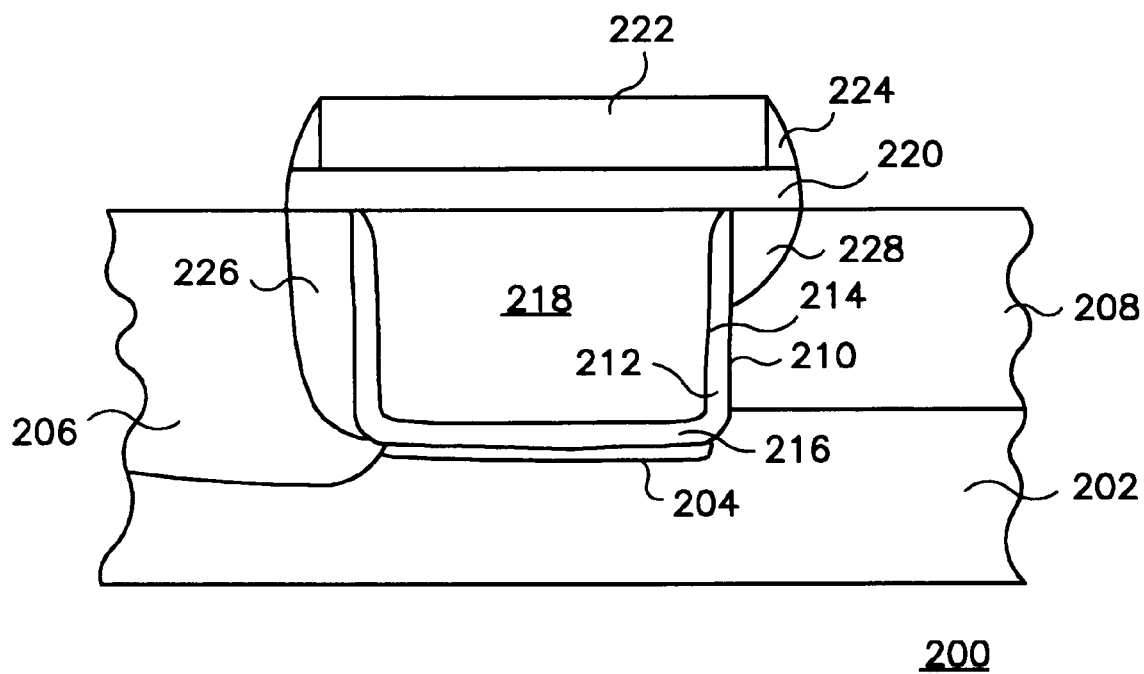
FIG. 2 is cross-sectional views of a dual gate device embodying the principles of the present invention.

FIG. 2 is a cross-sectional view of a non-volatile device embodying the principles of the present invention. FIG. 2 shows a semiconductor structure 200 including a substrate 202 of a semiconductor crystal such as silicon, according to one embodiment of the present invention. The substrate 202 is preferably p-doped or provided with a p-well to a suitable threshold voltage level in accordance with conventional silicon semiconductor fabrication techniques. Semiconductor structure 200 also includes a channel region 204, a sidewall doped region 206, a corner doped region 208, a trench 210, and a trench-to-gate insulating layer 212. Structure 200 also includes a trenched floating gate electrode 218, an inter-gate dielectric layer 220, a control gate electrode 222, and control gate spacers 224. Semiconductor structure 200 also includes a sidewall doping 226 and a corner doping 228.

Sidewall doped region 206 and corner doped region 208 are diffusion regions of semiconductor material that are doped with dopant impurities that have a conductivity which is opposite to the conductivity of substrate 202. For example, when substrate 202 is p-doped, the opposite conductivity type for sidewall doped region 206 and corner doped region 208 is n-doped. Preferably sidewall doped region 206 and corner doped region 208 are doped with "donor" or n-type impurities of phosphorous, arsenic or the like in conventional manner with a dose range on the order of approximately 1E14 atoms $cm^{-2}$ to approximately of 1E16 atoms $cm^{-2}$. Sidewall doped region 206 has a depth which is equal to or greater than the depth of trench 210, and corner doped region 208 has a depth which is less than the depth of trench 210. Sidewall doped region 206 partially extends laterally underneath the bottom of trench 210 to form a junction underneath a portion of the bottom of trench 210 as can be seen in FIG. 2. In other words, the junction is disposed along portions of the lower sidewall and the bottom of trench 210. In one embodiment of the present invention, sidewall doped region 206 is a source region for the device and corner doped region 208 is a drain region for the device. In another embodiment, sidewall doped region 206 is a drain region for the device and corner doped region 208 is a source region for the device. Channel region 204 is an implanted region formed beneath the bottom surface of trench 210. In a preferred embodiment, channel region 204 is a depletion type channel region. In such embodiment, channel region 204 is immediately contiguous to sidewall doped region 206 but is not immediately contiguous to corner doped region 208. According to one embodiment of the present invention, trench 210 is between approximately 100Å and 5000Å wide and from approximately 100Å to 5000Å deep. Preferably, trench 210 has rounded corners at the top and bottom of the trench, and the angle of the walls of trench 210 is substantially normal to the top surface. Alternatively, the angle of the trench walls may be slightly sloped to diverge upwardly. Trench-to-gate insulating layer 212 has preferably a high dielectric constant (K). Trench-to-gate insulating layer 212 may have different thicknesses on the vertical sidewalls inside trench 210 and on the bottom surface inside trench 210. For example, in one embodiment, the thickness of trench-to-gate insulating layer 212 on the vertical sidewall of trench 210 which is adjacent to sidewall doped region 206 may be thicker than the trench-to-gate insulating layer 212 on the vertical sidewall of trench 210 which is adjacent to corner doped region 208. The thicker trench-to-gate insulating layer 212 on the vertical sidewall of trench 210 which is adjacent to sidewall doped region 206 further decouples trenched floating gate electrode 218 and control gate electrode 222 from sidewall doped region 206. Preferably, the thickness of trench-to-gate insulating layer 212 is scaled according to the width of trench 210 such that the thickness of trenched gate dielectric spacer 214 does not comprise a significant part of the dimensions of trench 210. In other words, the thickness will preferably be scaled to reduce conduction along the sidewalls of trench 210 and to be optimized for the operational voltage of the device. For example, when trench 210 is approximately 3000Å to 5000Å wide, trench-to-gate insulating layer 212 is preferably equal to or slightly greater than 100Å. Trench-to-gate insulating layer 212 is preferably a dielectric film with a K approximately equal to or greater than 3.5. Trenched floating gate electrode 218 is formed over trench-to-gate insulating layer 212 inside trench 210. In a preferred embodiment, trenched floating gate electrode 218 has a top surface which is substantially planar with a top surface of substrate 202. Trenched floating gate electrode 218 is a conductive material such as polysilicon, preferably doped with n-type material, and is approximately of the same thickness as the depth of trench 210. Inter-gate dielectric layer 220 is preferably a high K dielectric material and preferably is an Oxide-Nitride-Oxide (ONO) layer. Control gate electrode 222 is a conductive material, such as polysilicon doped with n-type material or polysilicide, and is approximately 200–5000Å thick. Control gate spacers 224 are formed at the vertical side surfaces of control gate electrode 222 and on top of inter-gate dielectric layer 220, and are typically formed by first depositing a 100–2000Å thick layer of oxide in conventional manner and then etching the oxide with a reactive ion etch (RIE).

Sidewall doping 226 is a diffusion region of dopant impurities of one conductivity type, preferably p-type, and is formed in semiconductor substrate 202. Sidewall doping 226 is immediately contiguous to a vertical sidewall of trench 210 and to the substrate surface and extends substantially along the length of the sidewall of trench 210. Sidewall doping 226 is preferably doped with "acceptor" type impurities, such as boron, and is formed using an ion implant in conventional manner with a large angle of approximately 15 to 75 degrees and a dose range on the order of 1E13 atoms cm–2 to on the order of 1E15 atoms cm–2. The convention for determining the large angle is relative to the axis which is normal to the top surface of the substrate. In other words, 0 degrees means an implant along the axis which is normal to the top surface of the substrate and 90 degrees means an implant which is parallel to the top surface of the substrate. The width of sidewall doping 226 is approximately equal to the width of control gate spacers 224. Sidewall doping 226 reduces the coupling capacitances between sidewall doped region 206 and control gate 222 thus minimizing the sensitivity to misalignments between the control gate and the sidewall doped region. Additionally, sidewall doping 226 reduces leakages of electrons from the trenched gate electrode through the vertical sidewall of trench 210 which is immediately contiguous to sidewall doped region 206.

Corner doping 228 is a diffusion region of dopant impurities of one conductivity type, preferably p-type, and is immediately contiguous to an upper vertical sidewall of trench 210 which is opposite the vertical sidewall along which sidewall doping 226 is formed. The effective width of corner doping 228 is determined by the width of control gate spacers 224. The depth of corner doping 228 may be determined by at least two factors. In one embodiment, the depth of corner doping 228 is scaled to reduce the capacitance between control gate electrode 222 and corner doped region 208. In another embodiment, the depth of corner doping 228 is scaled to reduce the dielectric leakage along the corner of trench 210. Corner doping 228 is preferably doped with "acceptor" type impurities, such as boron, and may be formed using any one of several conventional methods. Preferably, corner doping 228 is formed with an implant in conventional manner at an angle of approximately 0 degrees, a dose range on the order of approximately 1E13 atoms cm$^{-2}$ to approximately 1E15 atoms cm$^{-2}$, and with an energy between approximately 1 keV to 60 keV.

Embodiments employing the principles of the present invention also provide low substrate current programming suitable for low power applications by using Fowler-Nordheim tunneling for both program and erase operations. As discussed above, the drain region may be either sidewall doped region 206 or corner doped region 208. While the operation of the present invention will be described in terms of an n-p-n device, it should be recognized that the operation of a p-n-p device is also possible by biasing the electrodes with an opposite polarity. All cells in a device may be globally programmed by positively biasing control gate electrode 222 so that channel region 204 is turned on and grounding all other nodes, i.e. the drain region, and the source region, and substrate 202. The result is an injection of electrons into trenched floating gate 218 through the vertical sidewall or corner of trench 210 adjacent to the drain region. Devices employing the principles of the present invention provide selective erasure of the individual cells in a device. The device is erased by negatively biasing control gate electrode 222 so that channel region 204 is turned off, and positively biasing the drain region which permits a higher drain bias without generating excess leakage. The source region and substrate 202 are left floating. The control gate electrodes 222 of unselected cells in an array are grounded. The selective erase improves the erase efficiency of the device and controls and reduces device leakages and the sensitivity to over-erase problems. Devices embodying the principles of the present invention are read by positively biasing control gate electrode 222 and the drain region, and grounding the source region and substrate 202.

Devices embodying the principles of the present invention may also be used for high speed applications by using hot carrier injection for programming the device and Fowler-Nordheim for erasing the device. Individual cells can be selectively programmed by positively biasing control gate electrode 222 and the drain region and grounding the source region and substrate 202. The control gate electrodes 222 of unselected cells in an array are grounded. The device may be globally erased by either grounding or negatively biasing control gate electrode 222 and positively biasing all other nodes.

One advantage of the present invention is the more planar topography of the trenched floating gate when compared to prior art non-volatile device structures. The more planar topography resulting from the reduced stacked gate height improves the process control and manufacturability of the device. The trenched gate structure also improves the device scaleability and cell packing density by reducing the lateral diffusion of the source and drain regions under the floating gate. The diffusion of the sidewall doped region disposed along portions of the lower sidewall and the bottom of the trench is a corner-limiting diffusion process which reduces the lateral diffusion of the sidewall doped region under the trenched floating gate. This corner-limiting diffusion process is described below in more detail with reference to FIG. 3J.

The sidewall doping of the present invention reduces the coupling capacitances between the gate electrodes and the sidewall doped region and reduces leakages from the vertical side of the trench immediately contiguous to the sidewall doping and from the control gate electrode. The sidewall doping also minimizes alignment sensitivities between the control gate electrode and the sidewall doped region. Finally, the sidewall doping creates a higher electrical field at the bottom corner of the trench where program and erase can occur.

The corner doping of the present invention minimizes the sensitivity to misalignments between the control gate electrode and the corner doped region by reducing the capacitance coupling between the control gate electrode and the corner doped region. The corner doping also improves isolation by reducing leakages through the corner of the trench which is immediately contiguous to the corner doping.

Figure 3A:
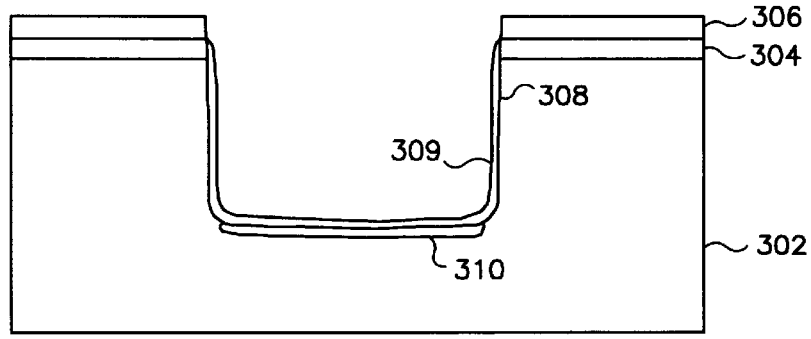
FIGS. 3A–3J are cross-sectional views of a semiconductor substrate in various stages of processing in accordance with one embodiment of the present invention.

FIGS. 3A–3J are cross-sectional views of a semiconductor substrate in various stages of processing in accordance with one embodiment of the present invention. While the present invention will now be described in terms of fabricating a single device structure, it should be recognized that the underlying process of the present invention may be employed to fabricate multiple devices on a single substrate. FIG. 3A is a cross-sectional view of a semiconductor wafer 300 comprising a substrate 302, a first pad oxide layer 304, a nitride layer 306, a trench 308, a second pad oxide layer 309, and a channel region 310. The substrate 302 is preferably a p-doped silicon substrate cut from a single silicon crystal. First pad oxide layer 304 is approximately 100Å thick and provides stress relief between substrate 302 and nitride layer 306. Nitride layer 306 has a thickness of approximately 1500Å and preferably comprises silicon nitride ($Si_3N_4$). Nitride layer 306 serves as a masking layer or etch stop for subsequent oxidation, chemical-mechanical polishing (CMP), and reactive ion etching. First pad oxide layer 304 and nitride layer 306 may be deposited in conventional manner by chemical vapor deposition (CVD) or other techniques. Trench 308 is formed in conventional manner using a reactive ion etch (RIE) to remove the silicon substrate. The trench etching process may include multiple steps such as a high selectivity nitride etch, an oxide etch and a high selectivity silicon to oxide etch. Second pad oxide layer 309 is approximately 100Å thick and is grown in conventional manner inside trench 308. Channel region 310 is preferably a depletion type channel region and may be formed using ion implantation of phosphorous in conventional manner with a dose range on the order of approximately 1E10 atoms cm$^{-2}$ to approximately 1E13 atoms cm$^{-2}$ and an energy of approximately 1 keV to 60 keV at an angle of approximately 0 degrees. Alternatively, channel region 310 may be formed using an ion implantation of boron in conventional manner.

Figure 3B:
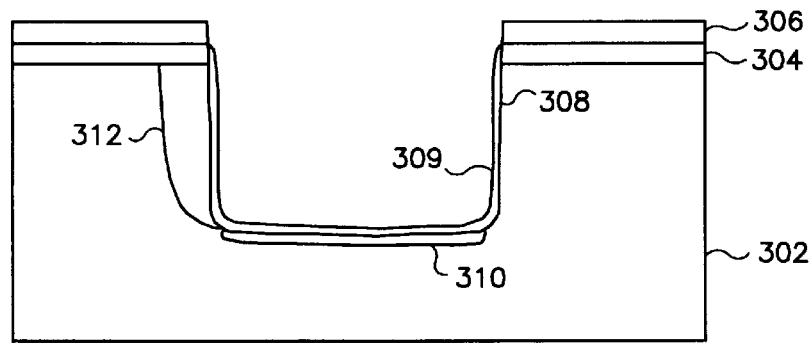

In one embodiment of the present invention, a sidewall doping is formed in the semiconductor substrate and is immediately contiguous to an upright vertical sidewall of one side of trench 308. After channel region 310 has been formed beneath the bottom surface of trench 308, semiconductor wafer 300 is implanted with dopant impurities of one conductivity type to form sidewall doping 312. FIG. 3B is a cross sectional view of semiconductor wafer 300 following implantation of sidewall doping 312. In one embodiment of the present invention, boron is implanted at a large angle, preferably around 15 to 75 degrees, with a dose range on the order of approximately 1E13 atoms cm$^{-2}$ to approximately 1E15 atoms cm$^{-2}$ and with an energy ranging from approximately 1 to 60 keV.

Figure 3C:
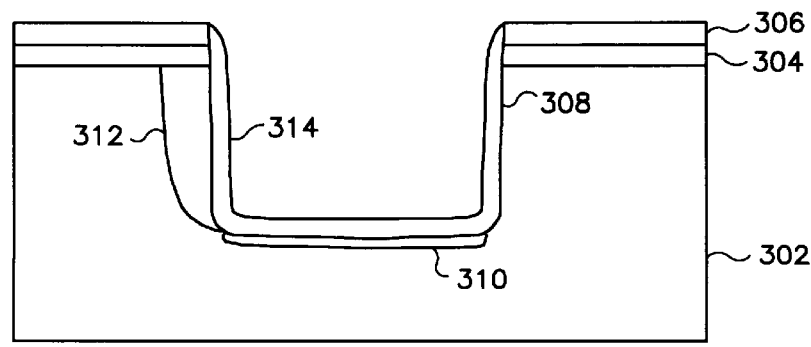

Next, second pad oxide layer 309 is removed in conventional manner by a wet chemical etch and a trench-to-gate dielectric layer is formed in conventional manner in trench 308 to isolate the trenched floating gate electrode from trench 308. FIG. 3C is a cross-sectional view of semiconductor wafer 300 following formation of trench-to-gate dielectric layer 314. Typically, a dielectric layer, such as a layer of thermally grown or deposited oxide, preferably nitridized, is formed in conventional manner on the substantially upright vertical sidewalls and on the bottom surface in trench 308. Preferably, the nitridized oxide has a K higher than about 3.5.

Figure 3D:
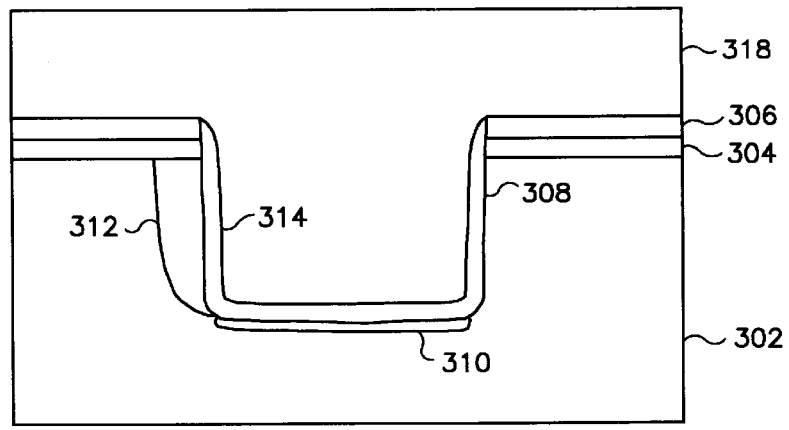

Semiconductor wafer 300 is then deposited with a layer of polysilicon 318 to form the trenched floating gate. FIG. 3D is a cross-sectional view of semiconductor wafer 300 following deposition of a layer of polysilicon 318. The thickness of polysilicon layer 318 is selected according to the depth of trench 308. In a preferred embodiment of the invention, the thickness of polysilicon layer 318 is between about 1000Å and 10,000Å. Typically, polysilicon layer 318 may be formed in conventional manner by low pressure chemical vapor deposition (LPCVD) and can be doped in site in conventional manner.

Figure 3E:
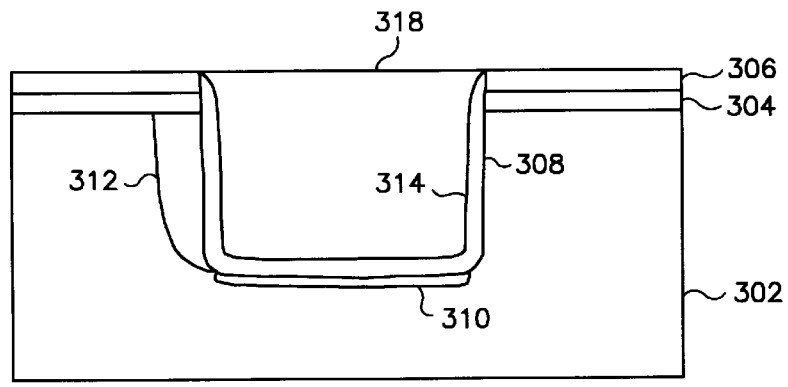
Figure 3F:
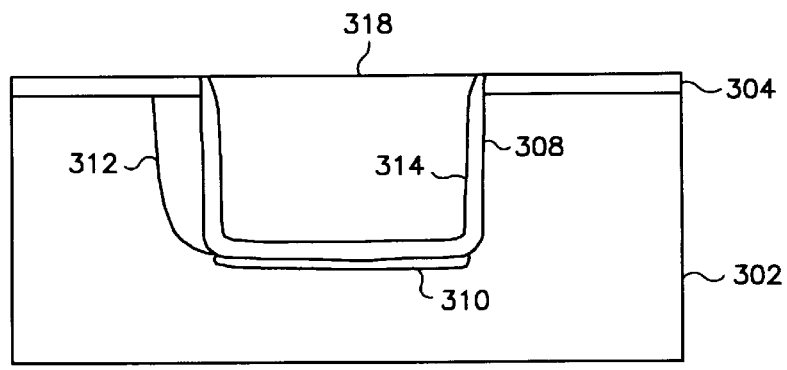

Polysilicon layer 318 is subsequently planarized to remove portions of the polysilicon. FIG. 3E is a cross-sectional view of semiconductor wafer 300 following planarization of polysilicon layer 318. Polysilicon layer 318 is planarized by using conventional techniques such as chemical-mechanical planarization (CMP). During a CMP, nitride layer 306 is used as an etch stop for the planarization process. Nitride layer 306 and a portion of polysilicon layer 318 which is above the silicon dioxide interface are then removed by a plasma etch as shown in FIG. 3F.

Figure 3G:
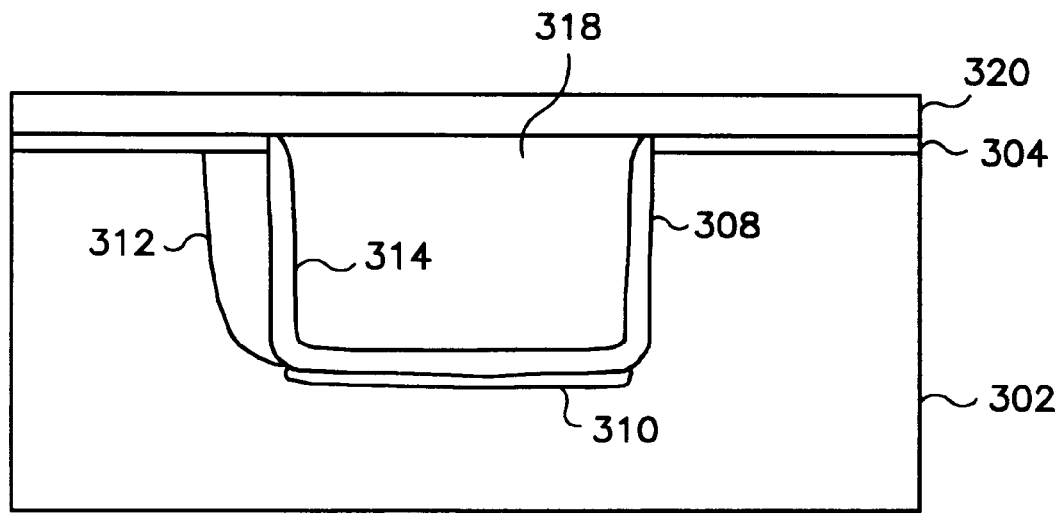
Figure 3H:
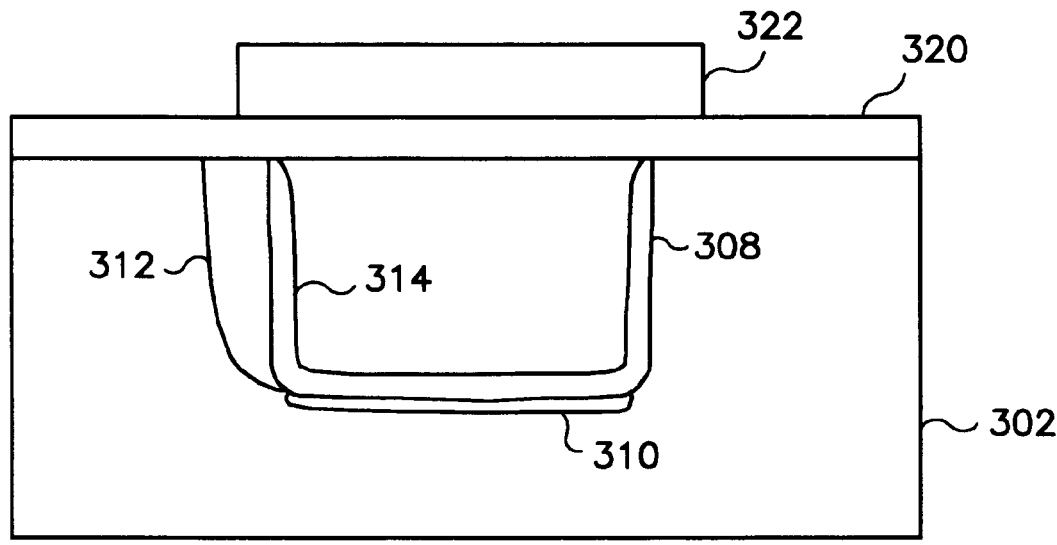

Next, an inter-gate dielectric layer 320 is deposited on the surface of polysilicon layer 318 and pad oxide layer 304. FIG. 3G is a cross-sectional view of semiconductor wafer 300 after forming inter-gate dielectric 320. The inter-gate dielectric 320 is preferably an Oxide-Nitride-Oxide (ONO) layer formed in conventional manner. After inter-gate dielectric 320 has been formed over substrate 302, a second layer of polysilicon or polysilicide 322 is deposited in conventional manner to form the control gate for non-volatile devices and is patterned using conventional photolithographic techniques. Second polysilicon or polysilicide layer 322 is etched in conventional manner using an RIE etch. FIG. 3H is a cross-sectional view of semiconductor wafer 300 after the control gate electrode has been formed. Preferably, the dimensions of the control gate should be slightly larger than the dimensions of trench 308. Alternatively, the dimensions of the control gate and the trench may be approximately equal such that they are fully aligned. The thickness of second polysilicon or polysilicide layer 322 is selected according to device vertical scaling. In a preferred embodiment of the present invention, the total thickness of second polysilicon or polysilicide layer 322 is between about 200 A and 5000 A. If polysilicon is used, it is preferably doped in site.

Figure 3I:
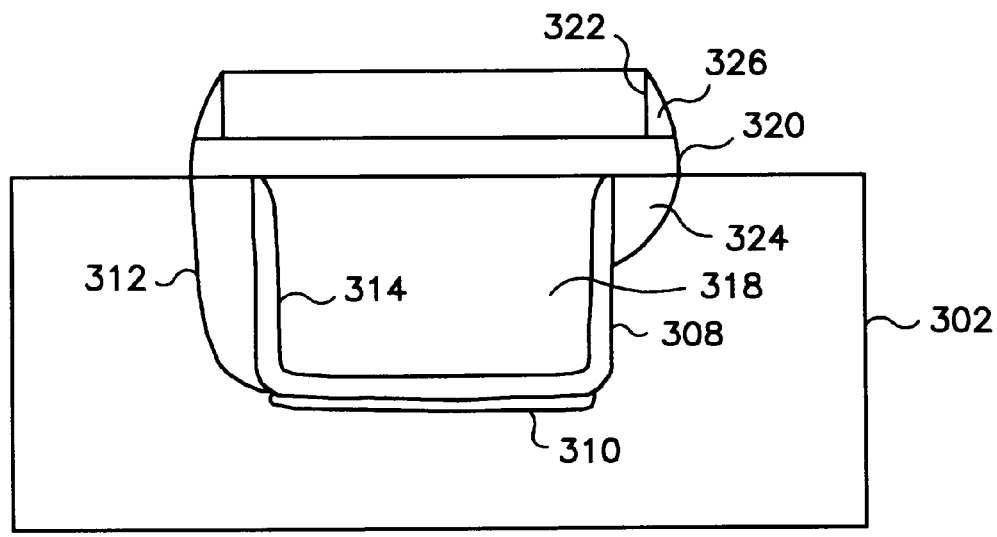

Thereafter, substrate 302 is implanted, preferably with p-type dopant impurities, to form a corner doping 324 in the semiconductor substrate. FIG. 3I is a cross-sectional view of semiconductor wafer 300 following formation of corner doping 324. Corner doping 324 is immediately contiguous to an upper vertical sidewall of trench 308 which is opposite the vertical sidewall along which sidewall doping 312 is formed. The implant is preferably done at an angle of 0 degrees, with a dose range on the order of approximately 1E13 atoms cm−2 to on the order of 1E15 atoms cm−2, and with an energy approximately between 1 keV to 60 keV. Alternatively, other conventional methods for forming corner doping 324 may be used. The effective width of corner doping 324 is determined by the width of the control gate spacers 326.

Next, control gate spacers 326 are formed at the side surfaces of second polysilicon or polysilicide layer 322 and on inter-gate dielectric 320. FIG. 3I is a cross-sectional view of semiconductor wafer 300 following formation of control gate spacers 326. Control gate spacers 326 are formed by first growing or depositing the spacer oxide in conventional manner over wafer 300 to between approximately 100 and 2000Å thick and then performing an RIE etch to fabricate the final form of control gate spacers 326. Control gate spacers 326 protect and define sidewall doping 312 and corner doping 324 of the trenched gate structure.

Figure 3J:
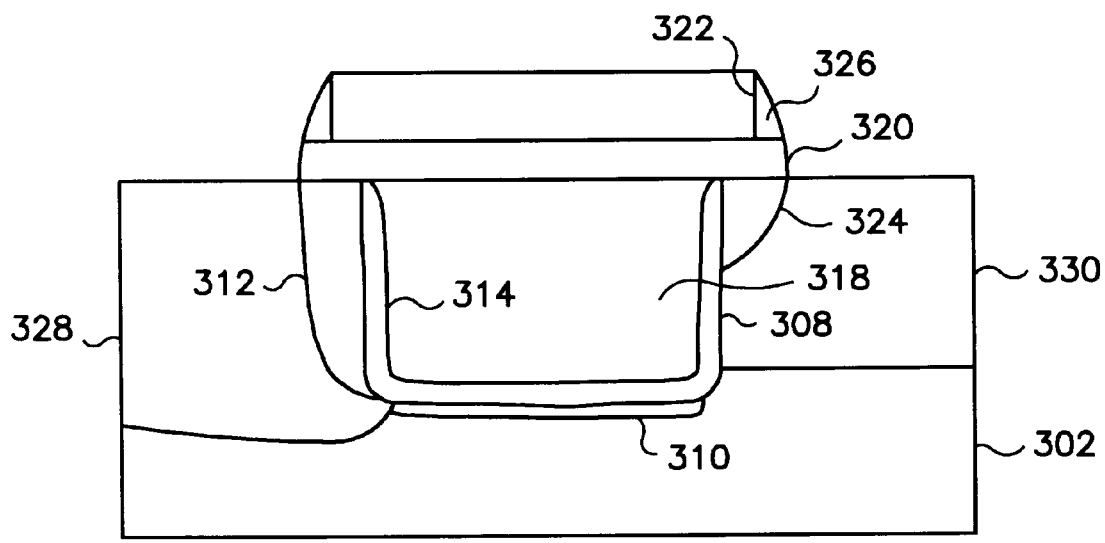

After formation of control gate spacers 326, conventional semiconductor processes are used to form sidewall doped region 328 and corner doped region 330 as shown in FIG. 3J. Preferably, multiple ion implantations of arsenic, phosphorous or a combination of arsenic and phosphorous with a dose range on the order of 1E14 cm$^{-2}$ to on the order of 1E16 cm$^{-2}$ are performed at different implant energies. Sidewall doped region 328 is formed such that the depth of sidewall doped region 328 is greater than the depth of trench 308. Preferably, sidewall doped region 328 is formed by a corner-limiting diffusion process. The corner-limiting diffusion process is primarily due to the corner effects of the trench, i.e., where the lower sidewall and bottom of the trench intersect. The implants for sidewall doped region 328 are immediately contiguous the sidewall of the trench with the deepest "as-implanted" dopant peak of the sidewall doped region being disposed at substantially the same depth as the depth of the trench before a thermal anneal. During anneal, the lateral diffusion of sidewall doped region 328 junction beneath the bottom surface of the trench is constrained by the amount of dopants available at the bottom corner, i.e. the intersection of the lower sidewall and bottom of the trench, and by the radial nature of the diffusion process. As a result, only a low percentage of dopant diffuses around the bottom corner of the trench, thus resulting in a corner-limiting process. Corner doped region 330 is formed such that the depth of corner doped region 330 is less than the depth of trench 308. Finally, standard MOS processes are used to complete processing of the semiconductor device.

Figure 4A:
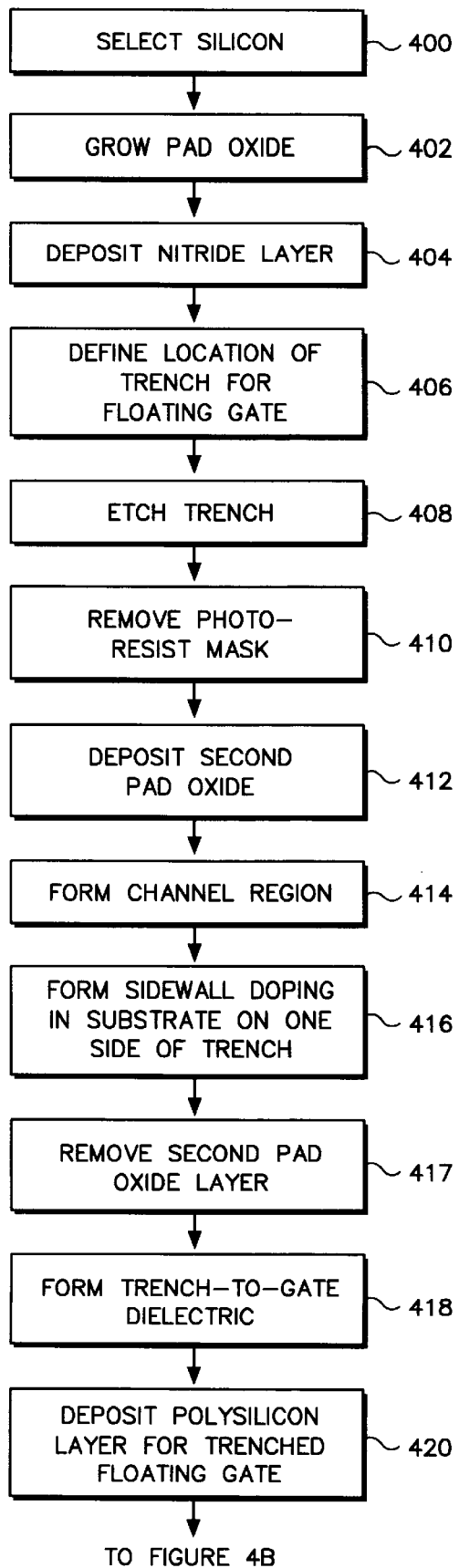
FIGS. 4A and 4B comprise a flow chart representing the stages of one embodiment of the process shown in FIGS. 3A–3J.
Figure 4B:
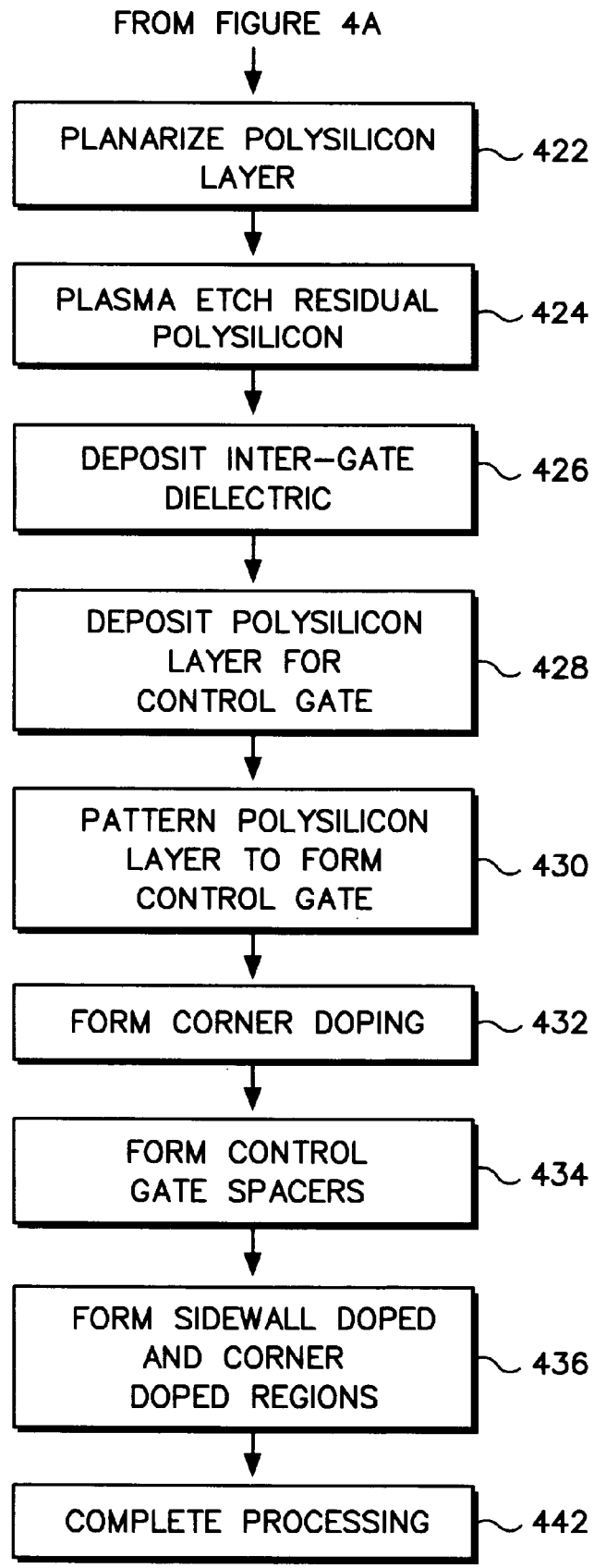

FIGS. 4A and 4B comprise a flow chart detailing one embodiment of the method of the present invention for fabricating a trenched gate semiconductor device with a sidewall doping and a corner doping. After a desired semiconductor substrate has been selected 400 for processing, a pad oxide layer and a nitride layer are formed 402, 404 on the substrate. The substrate is then masked with a photo-resist layer to define 406 the location of the floating gate trench. The exposed nitride and oxide layers and the underlying silicon substrate are etched 408 to remove the silicon substrate at the selected locations. After removal 410 of the photo-resist layer, a second layer of pad oxide is grown 412 on the substrate. Next, dopant ions for the channel region are implanted 414 using standard ion implantation techniques. The semiconductor wafer is then implanted at a large angle to form 416 a sidewall doping which is immediately contiguous to a vertical sidewall of the trench. Next, the second pad oxide layer is removed in conventional manner and a trench-to-gate dielectric layer is formed 418 on the vertical sides and on the bottom surface in the trench. Thereafter, a floating gate polysilicon layer is deposited 420 over the entire substrate to fill the trench. The polysilicon is planarized 422, preferably using a chemical-mechanical polish. A plasma etch 424 is then done to remove the nitride layer and a portion of the polysilicon layer above the silicon dioxide interface. Next, an inter-gate dielectric layer is deposited and patterned 426 using conventional thermal and CVD techniques. A second layer of polysilicon or a layer of polysilicide is then deposited 428 on the substrate and patterned and etched using conventional photo-lithographic techniques to form the control gate 430. Thereafter, a corner doping is formed in the semiconductor substrate and is immediately contiguous to an upper vertical sidewall of the trench which is opposite the vertical sidewall along which the sidewall doping is formed. The control gate spacers are then formed 434 at the side surfaces of the control gate and on the inter-gate dielectric layer. Next, a sidewall doped region and a corner doped region are formed 436 in the substrate using conventional ion implantation techniques. Finally, standard processing techniques are used to complete processing 442 of the device.

What is claimed is:

1. A semiconductor transistor comprising:

a semiconductor substrate of one conductivity type having a top surface;

a sidewall doped region of opposite conductivity type formed in the semiconductor substrate;

a corner doped region of the opposite conductivity type formed in the semiconductor substrate spaced from the sidewall doped region in the semiconductor substrate;

a trench having substantially upright vertical sidewalls and a bottom surface at a desired depth, formed in the semiconductor substrate intermediate separating the sidewall doped region and the corner doped region; the sidewall doped region having a depth greater than the desired depth of the trench, and the corner doped region having a depth less than the desired depth of the trench;

a channel region formed beneath the bottom surface of the trench and immediately contiguous the sidewall doped region;

a trench-to-gate insulating layer formed inside the trench;

a trenched floating gate electrode formed inside the trench and on the trench-to-gate insulating layer and having a top surface;

an inter-gate dielectric layer formed on the top surface of the trenched floating gate electrode;

a control gate electrode formed on the inter-gate dielectric layer and having side surfaces;

a corner doping of the one conductivity type formed in the corner doped region immediately contiguous the upper substantially upright vertical sidewall of the trench and immediately contiguous the substrate surface; and a sidewall doping of the one conductivity type formed in the sidewall doped region immediately contiguous the substantially vertical sidewall of the trench and immediately contiguous the substrate surface.

2. The semiconductor transistor of claim 1 wherein the top surface of the trenched floating gate electrode is substantially planar to the top surface of the semiconductor substrate.

3. The semiconductor transistor of claim 1 wherein the channel region is a depletion type channel region.

4. The semiconductor transistor of claim 1 wherein the thickness of the trench-to-gate insulating layer formed on the substantially upright vertical sidewalls inside the trench is thicker than the thickness of the trench-to-gate insulating layer formed on the bottom surface inside the trench.

5. The semiconductor transistor of claim 1 wherein the sidewall doped region is formed by a self-limiting diffusion process and is disposed contiguous portions of the sidewalls and the bottom of the trench.

6. The semiconductor transistor of claim 1 wherein the sidewall doped region is a source region and the corner doped region is a drain region.

7. The semiconductor transistor of claim 1 wherein the sidewall doped region is a drain region and the corner doped region is a source region.

8. A method of fabricating a semiconductor device having a trenched gate, a sidewall doping, and a corner doping in a semiconductor substrate comprising:

etching the semiconductor substrate to form a trench having substantially upright vertical sidewalls and a bottom surface in the semiconductor substrate;

forming a channel region beneath the bottom surface of the trench;

forming a trench-to-gate insulating layer inside the trench;

forming a trenched gate electrode on the trench-to-gate insulating layer inside the trench;

forming a sidewall doped region and a corner doped region in the semiconductor substrate;

forming an inter-gate dielectric layer on a top surface of the trenched gate electrode;

forming a control gate electrode on a top surface of the inter-gate dielectric layer;

forming a corner doping in the corner doped region immediately contiguous the upper vertical sidewall of the trench and immediately contiguous a surface of the semiconductor substrate; and forming a sidewall doping in the sidewall doped region immediately contiguous the substantially upright vertical sidewall of the trench and immediately contiguous the surface of the semiconductor substrate.

9. The method of claim 1 further comprising the step of forming control gate spacers at substantially upright vertical sides of the control gate electrode.

10. The method of claim 1 wherein the step of forming a trenched gate electrode further comprises:

depositing a layer of polysilicon on the trench-to-gate insulating layer inside the trench; and planarizing the layer of polysilicon to substantially planar orientation with a top surface of the semiconductor substrate.

11. The method of claim 10 wherein the step of forming a channel region comprises the step of forming a depletion type channel region.

12. The method of claim 10 wherein the step of forming the sidewall doped region and corner doped region comprises multiple implants.

13. A semiconductor device comprising an array of multiple device structures, each device structure spaced from other device structures and comprising:

a sidewall doped region of one conductivity type formed in a semiconductor substrate;

a corner doped region of the one conductivity type formed in the semiconductor substrate spaced from the sidewall doped region in the semiconductor substrate;

a trench having vertical sidewalls and a bottom surface, formed in the semiconductor substrate intermediate the sidewall doped region and the corner doped region;

a channel region formed beneath the bottom surface of the trench and immediately contiguous to the sidewall doped region;

a trench-to-gate insulating layer formed in the trench;

a trenched floating gate electrode having a top surface and formed on the trench-to-gate insulating layer inside the trench;

an inter-gate dielectric layer formed on the top surface of the trenched floating gate electrode;

a control gate electrode formed on the inter-gate dielectric layer, the second gate electrode having side surfaces;

a corner doping of an opposite conductivity type formed in the corner doped region immediately contiguous the upper vertical sidewall of the trench and immediately contiguous the substrate surface; and a sidewall doping of the opposite conductivity type formed in the sidewall doped region immediately contiguous the vertical sidewall of the trench and immediately contiguous the substrate surface.

14. The semiconductor device of claim 1 wherein the depth of the sidewall doped region is greater than the depth of the trench, and the depth of the corner doped region is less than the depth of the trench.

15. The semiconductor device of claim 1 wherein the top surface of the trenched floating gate electrode is substantially planar to a top surface of the semiconductor substrate.

16. The semiconductor device of claim 15 wherein the channel region is a depletion type channel region.

17. The semiconductor device of claim 15 wherein the sidewall doped region is formed by a self-limiting diffusion process and is disposed contiguous portions of the sidewalls and the bottom of the trench.

* * * * *